(12) United States Patent
Hsiao (10) Patent No.: US 6,695,946 B2
(45) Date of Patent: Feb. 24, 2004

(54) COOLING SYSTEM

(75) Inventor: Tien-En Hsiao, Hsin-chu (TW)

(73) Assignee: Applied Materials Inc., Santa Clara, CA (US)

( * ) Notice: Subject to any disclaimer, the term of this patent is extended or adjusted under 35 U.S.C. 154(b) by 12 days.

(21) Appl. No.: 09/837,943

(22) Filed: Apr. 18, 2001

(65) Prior Publication Data

US 2002/0153100 A1 Oct. 24, 2002

(51) Int. Cl.[7] .................. H01L 21/306; C23C 16/00
(52) U.S. Cl. ................. 156/345.24; 156/345.53; 156/345.13; 156/345.15; 156/345.26; 156/345.28; 118/715
(58) Field of Search ............. 156/345.13, 345.15, 156/345.24, 345.26, 345.28; 118/715

(56) References Cited

FOREIGN PATENT DOCUMENTS

| JP | 05049904 A | * | 3/1993 | ............ B01J/3/00 |
| JP | 07161696 A | * | 6/1995 | ............ C23F/4/00 |
| JP | 07176520 A | * | 7/1995 | ....... H01L/21/3065 |
| JP | 10176971 A | * | 6/1998 | ............ G01M/3/26 |
| JP | 11154669 A | * | 6/1999 | ............ F26B/21/00 |
| JP | 11284016 A | * | 10/1999 | ............ H01L/21/60 |
| JP | 11297802 A | * | 10/1999 | ............ B23Q/3/15 |
| JP | 11353032 A | * | 12/1999 | ............ G05B/23/02 |

OTHER PUBLICATIONS

Ralph J Smith, Circuits devices, and systems, 1976, John Wiley & Sons, Third edition pp. 158–161 and 511–513.*
Product announcement dated May 25, 1999 MKS instruments.*

* cited by examiner

Primary Examiner—Gregory Mills
Assistant Examiner—Ram N Kackar
(74) Attorney, Agent, or Firm—Sughrue, Mion, Zinn, Macpeak & Seas; Joseph Bach (57) ABSTRACT

A cooling system and a semiconductor apparatus, in which the cooling system may supply a reaction chamber with a coolant (such as helium or a mixture containing helium) during a semiconductor wafer fabrication process. The cooling system may generally include a printed circuit board, a coolant flow controller having a setpoint control to set a flow of coolant by transmitting a voltage signal to the printed circuit board, and a filter for removing undesired noise from the voltage signal to stabilize the flow of coolant.

25 Claims, 7 Drawing Sheets

COOLING SYSTEM

FIELD OF THE INVENTION

The present invention is related generally to the field of semiconductor wafer manufacturing, and more particularly to a cooling system for a semiconductor wafer fabrication apparatus.

BACKGROUND OF THE INVENTION

During many semiconductor fabrication processes, a semiconductor wafer is cooled by an assembly adapted to provide a supply of coolant, such as helium, for example, to the back side of the wafer (that is, the side of the wafer in contact with the chuck) during the fabrication process. The coolant supply is not always uniform, however, and fluctuating coolant mass flow may exert instantaneous forces on the wafer which overcome the relatively constant force biasing the wafer to an electrostatic chuck. In cases where the net force on the wafer is non-zero, a force differential may cause a portion of the wafer to rise above the chuck; in extreme cases, an abnormally high flow rate of coolant may even cause the entire wafer to move or to be raised off the chuck. These situations cause alignment complications during a fabrication process, and are undesirable.

When uniform contact of the wafer with the chuck is compromised, the apparatus or process chamber will typically sound an alarm through a warning system. This alarm and the subsequent corrective action which must be taken to return the apparatus to acceptable operating conditions tend to increase the cycle time for wafer manufacturing.

Figure 1:
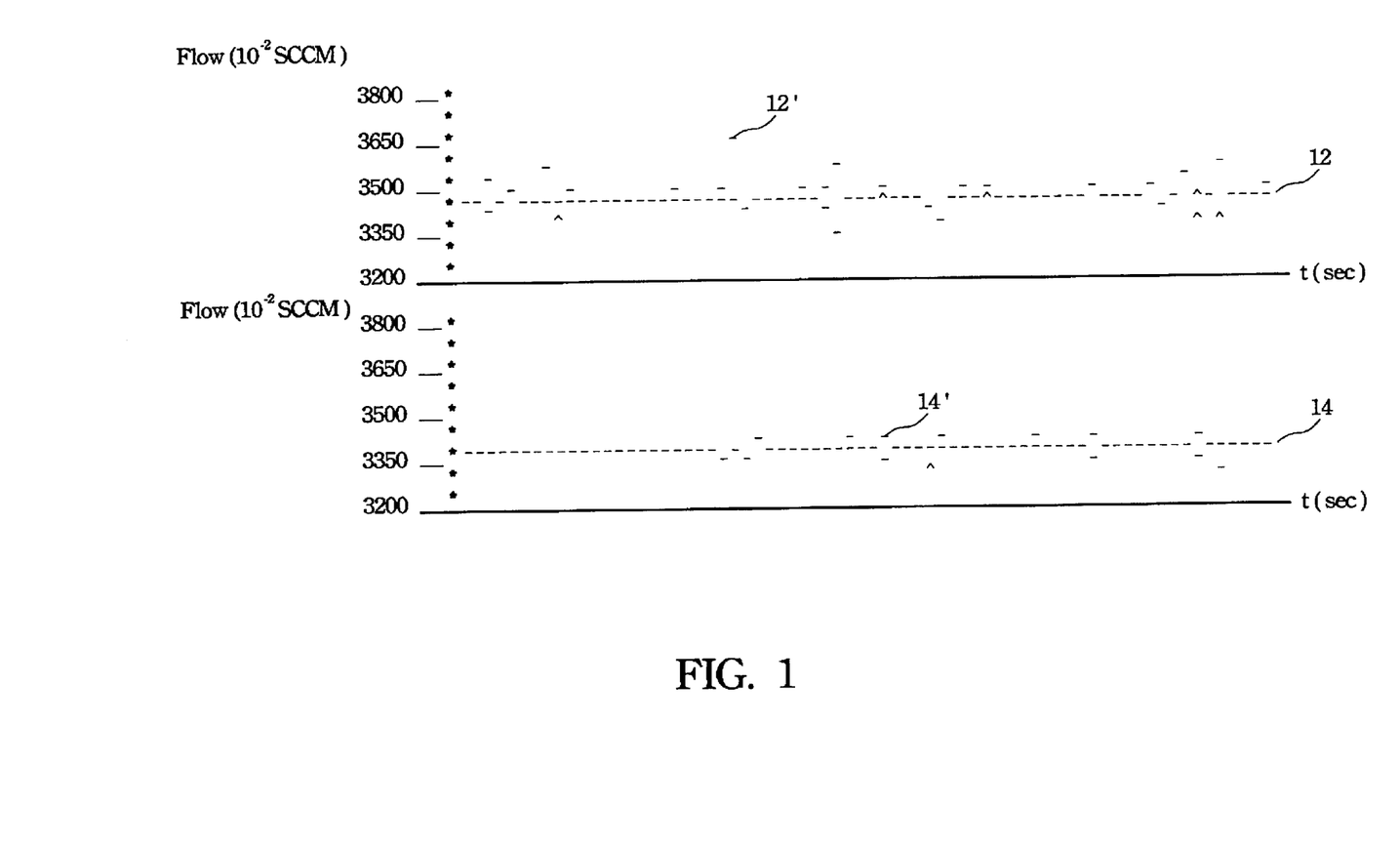
FIG. 1 is a graphical representation of signals indicative of the mass flow of coolant in a conventional system.

In a conventional coolant supply circuit arrangement, an input voltage of about +15V, for example, may be used for setting a desired coolant mass flow. In an exemplary system, such an input may be intended to regulate the mass flow of coolant at about 30 standard cubic centimeters (sccm), for example, per unit time. As noted above, however, the flow or the pressure of coolant is generally not constant and may spike abruptly. FIG. 1 is a graphical representation indicating the mass flow of helium coolant as a function of time in such a conventional system. In FIG. 1, time (in seconds) is measured along the abscissa, while the mass flow of helium (in $10^{-2}$ sccm) is represented by the ordinal value. As indicated by the two spiking dotted lines 12 and 14, and by noise spikes 12' and 14', the helium flow is not uniform.

SUMMARY OF THE INVENTION

The cooling system of the present invention overcomes the foregoing and other shortcomings of conventional systems which suffer from fluctuating coolant mass flow rates or pressures.

In accordance with one aspect of the invention, a cooling system may be used in conjunction with an etching chamber, and may supply a wafer inside the etching chamber with coolant during an etching process. The inventive cooling system may generally be constituted by a printed circuit board, a coolant flow controller having a setpoint control to set a flow of coolant by transmitting a voltage signal to the printed circuit board, and a filter for removing undesirable noise from the voltage signal to stabilize the flow of coolant.

In accordance with another aspect of the present invention, an apparatus for manufacturing semiconductor devices may include an integrated cooling system. The apparatus may generally be constituted by a reaction chamber for performing a semiconductor process on a wafer therein and a cooling system for supplying a flow of coolant to the wafer during processing. The apparatus may include a structure or mechanism for controlling a flow of coolant used to cool the wafer when the semiconductor fabrication process is performed, wherein the structure or mechanism for controlling has a setpoint control to set the flow of coolant by transmitting a voltage signal to a printed circuit board, and may further incorporate a mechanism for removing undesirable noise from the voltage signal.

The foregoing and other attendant advantages of the present invention will become more apparent to those of ordinary skill in the art upon examination of the following detailed description of embodiments thereof with reference to the drawings.

DETAILED DESCRIPTION OF THE PREFERRED EMBODIMENTS

Turning now to the drawings, FIG. 1 is a graphical representation of signals indicative of the mass flow of coolant in a conventional system. As noted briefly above, in an etching apparatus, an etching process may be performed on a wafer in a reaction chamber. In the reaction chamber, the wafer may be supported by an electrostatic chuck (ESC or chuck), for example, which biases the wafer to a support surface of the chuck through voltage potential. Through the chuck, a coolant may be supplied to the backside of the wafer (i.e. the surface of the wafer facing the support surface of the chuck) for cooling during the etching process.

The coolant, such as helium or a helium mixture, for example, may generally be supplied by a cooling system which may be constituted by a coolant supply assembly. Such a coolant supply assembly may be located under, or in a convenient location proximal to, the reaction chamber, and may typically be situated such that coolant may be supplied to the reaction chamber easily.

By way of example, coolant composition may generally include liquid helium combined with a mixture of ethylene glycol and de-ionized (DI) water in varying proportions depending upon the application. Coolant temperature, likewise, may be application-dependent, and therefore may vary as a function of reaction chamber chemistries, for example.

Figure 2:
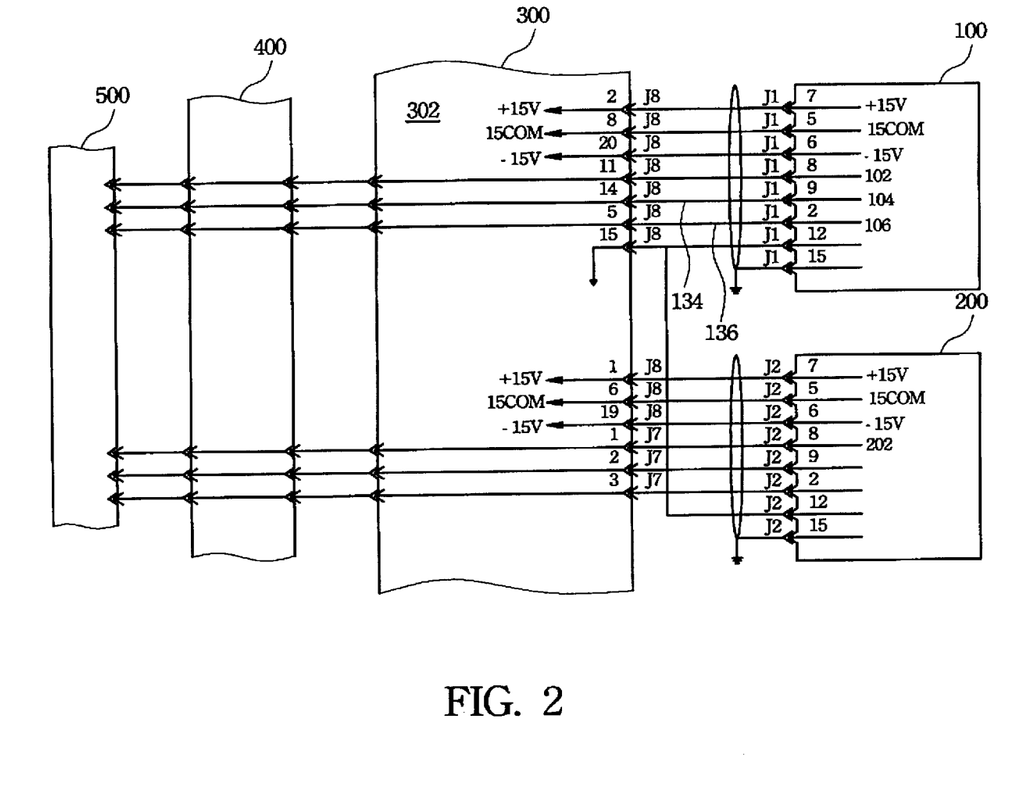
FIG. 2 is a simplified schematic diagram of the circuits and devices employed by one embodiment of a coolant supply assembly.

FIG. 2 is a simplified schematic diagram of the circuits and devices which may be employed by one embodiment of a coolant supply assembly. The exemplary coolant supply assembly of FIG. 2 may generally be constituted by an interconnect printed circuit board (INTCNT PCB) 300, a controller Input/Output (I/O) printed circuit board (I/O PCB) 400, and an Analog Input/Output (AI/O) printed circuit board (AI/O PCB) 500.

Additionally, a coolant supply assembly may further include a coolant flow controller, such as an Independent Helium Controller-Mass Flow Controller (IHC-MFC) 100, for controlling coolant mass flow. IHC-MFC 100 may advantageously have a setpoint control 102 for setting a flow of coolant by transmitting a voltage signal to INTCNT PCB 300 through a filter (not shown in FIG. 2). As illustrated in FIG. 2, an additional, independent IHC-MFC 200 may be incorporated into a coolant supply assembly. IHC-MFC 200 may also have a setpoint control 202 for setting a flow of coolant by transmitting a voltage signal to the INTCNT PCB 300 through a filter (also not shown in FIG. 2).

In operation, a voltage signal from setpoint control 102, 202 may be transmitted from INTCNT PCB 300 to I/O PCB 400. Subsequently, the voltage signal may be transmitted to AI/O PCB 500.

It will be appreciated by those of skill in the art that the voltage signal transmitted from setpoint control 102,202 to INTCNT PCB 300 may have some associated noise, such as represented at 12',14' in FIG. 1. This noise, however, may be removed by the filter as described below; as a consequence, the flow of coolant may therefore be stabilized. Additionally, setpoint control 102,202 may also be employed for setting a coolant pressure, which may be proportional to mass flow as is known in the art. It will also be appreciated that by removing noise from the voltage signal, coolant pressure may also be stabilized.

Figure 3:
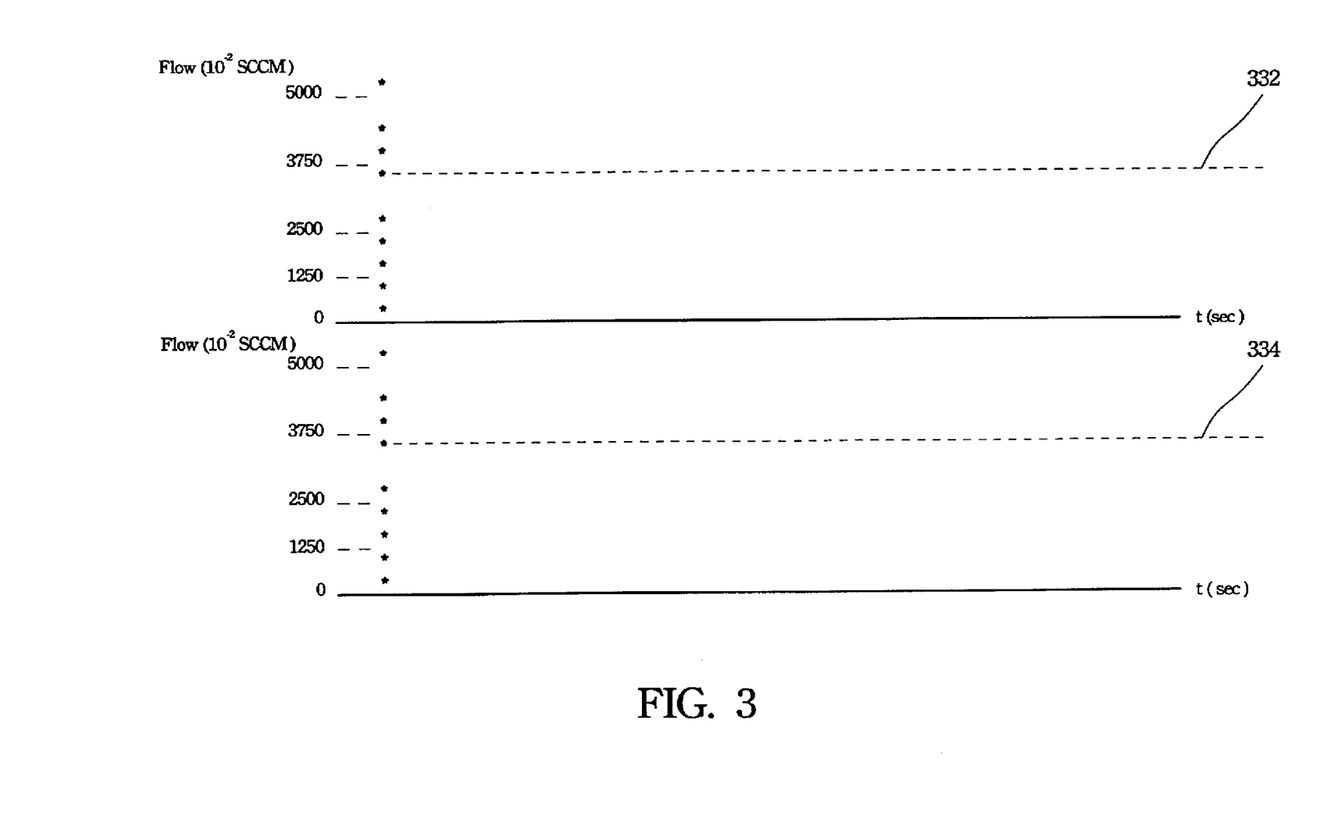
FIG. 3 is a graphical representation of the AI signal from the FLOW terminal.

Generally, the voltage signal transmitted from setpoint control 102,202 may be an Analog Output (AO) signal, while the signal at the FLOW terminal 104 or the PRESSURE terminal 106 may be an Analog Input (AI) signal. Each of the AI signals may advantageously be fed back (through a signal feedback loop, for example) to a central processing unit (CPU) of a computer after the flow or the pressure of coolant is read at the FLOW terminal 104 or the PRESSURE terminal 106. Voltage signal output from setpoint control 102,202 may be adjusted according to the AI signals at FLOW and PRESSURE terminals 104,106 fed to a CPU. FIG. 3 is a graphical representation of the AI signal from the FLOW terminal 104 (indicative of coolant mass flow), which is displayed on a monitor of a computer; it should be noted that the graph of FIG. 3 is representative of the AI signal at FLOW terminal 104 with the filter and feedback functionality of the inventive cooling system in operation as discussed in detail below.

Still referring to FIG. 2, the terminals indicated by +15V and −15V represent power terminals for each IHC-MFC 100,200. In other words, IHC-MFC 100,200 may receive operating power from terminals +15V and −15V. The voltage at setpoint control 102, which may be input by an operator and/or adjusted according to feedback as noted above, for example, may determine the desired mass flow and pressure of coolant. Hereinafter, the "flow" of coolant refers to the mass flow (represented by the arrow) through conduit 410 in FIG. 4, while the "pressure" of coolant refers to the pressure of the flow in conduit 410.

Figure 5:
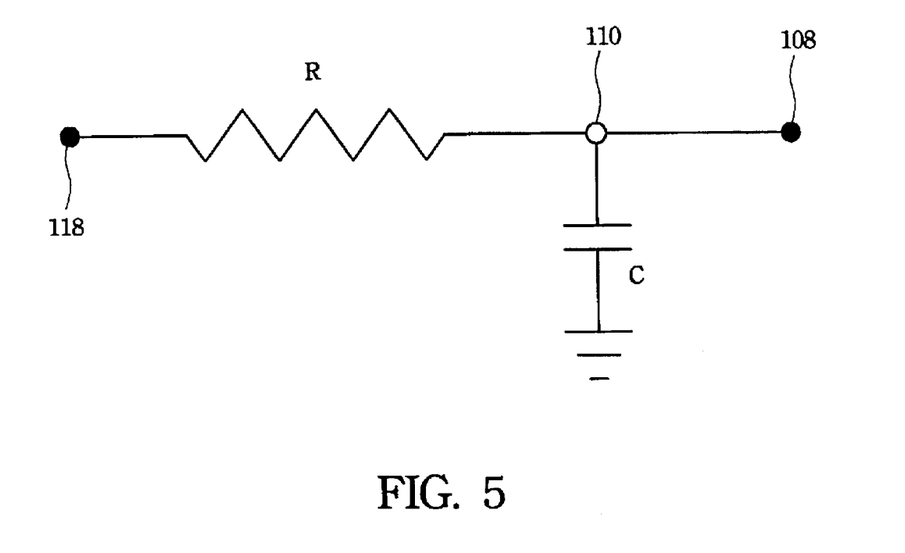
FIG. 5 is a simplified circuit diagram illustrating one embodiment of a filter for removing noise from a voltage signal.

FIG. 5 is a simplified circuit diagram illustrating one embodiment of a filter for removing noise from a voltage signal. As shown in FIG. 5, the filter may generally be constituted by a resistor R and a capacitor C electrically connected. In the exemplary embodiment illustrated in FIG. 5, it may be desirable to select capacitor C and resistor R such that the filter has a "lag" or delay time of less than three seconds; the components may be selected in such a way as to control the delay time depending upon the reaction chamber alarm system. For example, an etching apparatus as mentioned above may be equipped with a warning system which detects coolant mass flow and pressure after the coolant has been supplied for three seconds. The detection may continue for half a second, i.e. until the coolant has been flowing for 3.5 seconds.

If the delay time of the filter exceeds the duration of the alarm system's latency, the filter may not be able to remove noise from the voltage signal before the warning system detects the flow of coolant. Accordingly, the delay time of the filter is preferably set such that noise may be removed from the voltage signal before the apparatus warning system detects the coolant flow; the combination of resistor R and capacitor C may be selected so as to satisfy this requirement.

It will be appreciated that the foregoing time periods are provided by way of example only, and are not intended to be construed in any limiting sense. Specifically, the foregoing time periods may be set in accordance with requirements of various processes or apparatus. As noted above, the filter preferably has a delay time selected such that the filter may remove noise from the voltage signal before the time period set for detection of the flow rate and pressure.

By way of example, the capacitor illustrated in FIG. 5 may have a capacitance of about 220 $\mu$F, while the resistor may have a resistance of about 1.6K ohms. The combination of such capacitance and resistance results in a delay time of about 0.352 seconds (1.6K ohms×220 $\mu$F) for the filter. Such a delay time is appreciably less than the time period typically required for coolant flow detection.

The inventive cooling system and method increase the uniformity of cooling during a semiconductor wafer fabrication process; as a consequence, the uniformity of the fabrication process and the uniformity of the manufactured wafer are increased. Although the reaction chamber apparatus is often equipped with a warning system, such warning systems typically detect coolant flow and pressure only during discrete periods of time, i.e. intermittently, as described above. In a system or apparatus employing an alarm system which intermittently monitors coolant mass flow and pressure, providing a uniform flow and pressure of coolant becomes more important, since such uniformity ensures continuously uniform cooling even when the alarm system is not monitoring coolant flow parameters. Moreover, if a non-uniform flow of coolant is sufficient to move or to misalign a wafer, the wafer may fall or otherwise be damaged during the process itself or during robotic removal of the wafer from the chamber after the process is completed; stabilizing coolant flow continuously during operation prevents such undesirable consequences of non-uniform flow.

It will be appreciated by those of skill in the art that the following description of a filter for use in the inventive cooling system is provided by way of example only, and not by way of limitation. Other types of filters having different circuit elements and alternative circuit designs are within the scope and contemplation of the invention.

With reference now to FIGS. 2 and 5, the filter may include a node 110 between resistor R and capacitor C.

Moreover, the filter may include one terminal 108 electrically connected to a plug J1-8 of the setpoint control 102. Furthermore, the filter may include another terminal 118 electrically connected to a junction J8-11 of INTCNT PCB 300, wherein the junction J8-11 may accommodate, for example, 15 pins.

Figure 7:
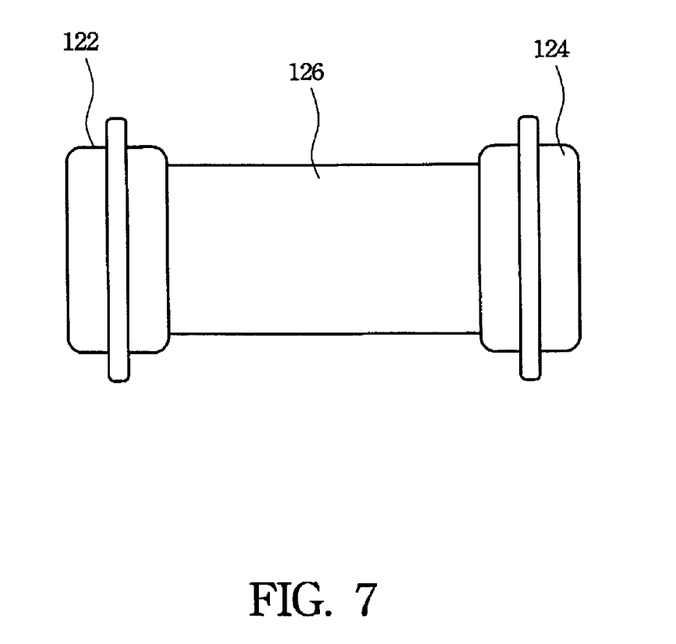
FIG. 7 is a diagram illustrating the external appearance of one embodiment of a filter.

FIG. 7 is a schematic diagram illustrating the appearance of one embodiment of a filter. One end of the filter may include a plug 122, while the other end of the filter may include a junction 124. By way of example, electrical connections may be as follows: junction 124, disposed at terminal 108 of the R/C circuit (FIG. 5), may be electrically connected to the plug J1-8 of setpoint control 102 (FIG. 2); accordingly, setpoint control 102 may be electrically connected to node 110 through the plug J1-8; plug 122, disposed at terminal 118 of R/C circuit (FIG. 5), may be electrically connected to the junction J8-11 of INTCNT PCB 300; accordingly, the end of resistor R (FIG. 5) distant from node 110 may be electrically connected to INTCNT PCB 300 through plug 122. The end of capacitor C distant from node 110 may be grounded, while the other end of capacitor C proximal to node 100 may be electrically connected to INTCNT PCB 300.

As illustrated in FIG. 7, a casing or housing 126 may be used to wrap or to protect the R/C circuit shown in FIG. 5. Casing 126 may be made of plastic, ceramic, or other suitable insulating material.

The R/C circuit illustrated in FIG. 5 may be alternatively employed in the form of an integrated circuit. According to basic principles of circuit design, a circuit such as shown in FIG. 6 may be particularly useful for removing noise from a voltage signal.

Figure 6:
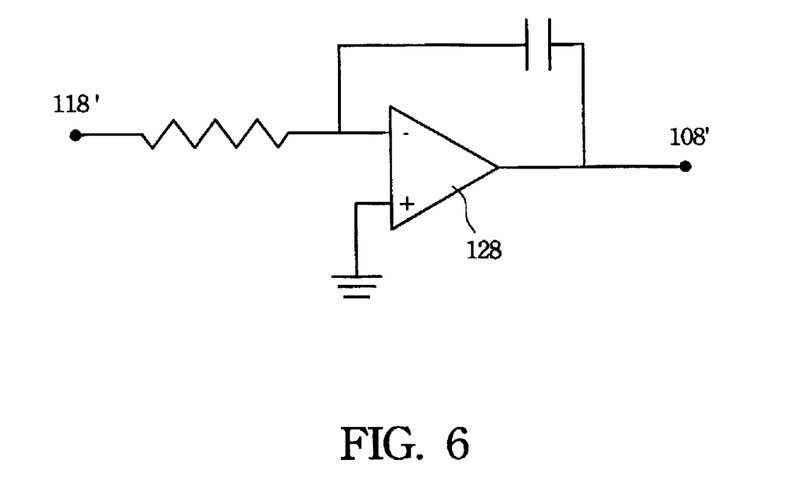
FIG. 6 is a simplified circuit diagram illustrating one embodiment of a filter for removing noise from a voltage signal.

FIG. 6 is a simplified circuit diagram illustrating one embodiment of a filter for removing noise from a voltage signal. The integrated circuit, which is shown as further including an amplifier 128, may advantageously employ a more complicated design than the simple R/C circuit filter in FIG. 5. As shown in FIG. 6, the terminal 108' may be electrically connected to the plug J1-8 of setpoint control 102, while the terminal 118' may be electrically connected to the junction J8-11 of INTCNT PCB 300.

The present cooling system may be employed with an etching apparatus, for example, or other reaction chamber apparatus. The cooling system may generally include a joint chamber tray 302 (including INTCNT PCB 300; see FIG. 2), and further may include two or more independent IHC-MFC assemblies disposed on the joint chamber tray 302. Each IHC-MFC assembly, in turn, may include an IHC-MFC 100 for an inner zone 810 (FIG. 8) of a chuck 800, and an IHC-MFC 200 for an outer zone 820 of a chuck 800.

Figure 8:
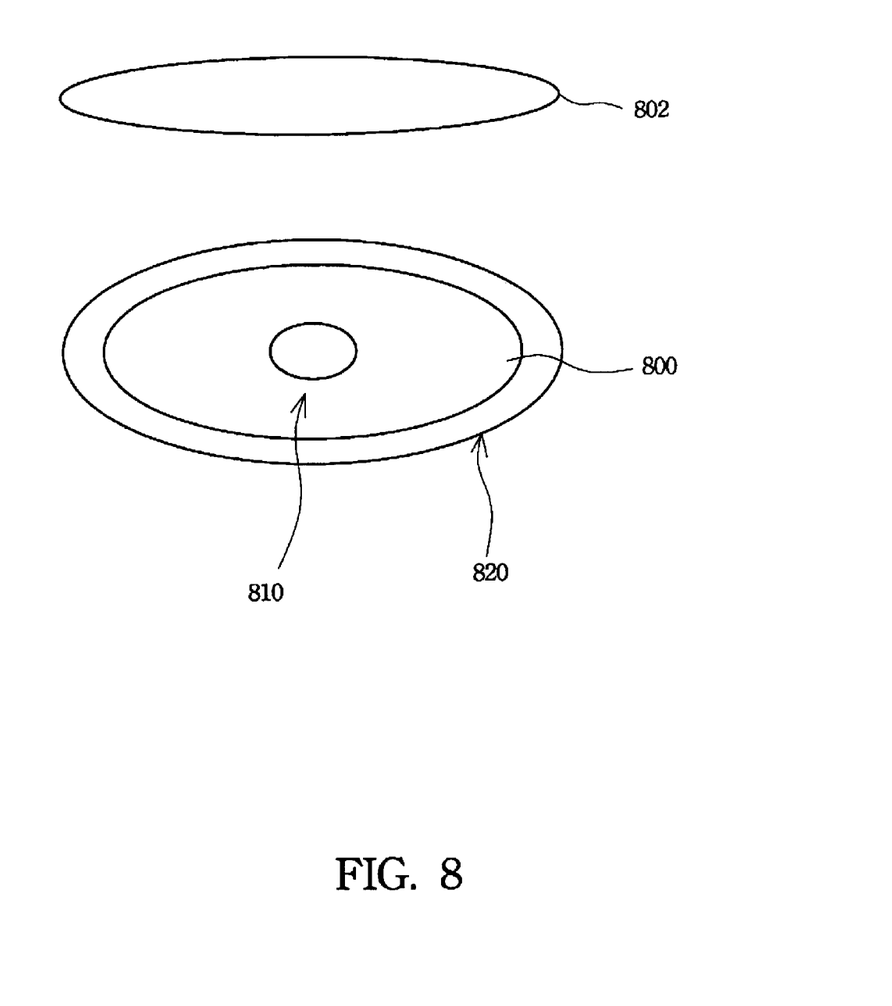
FIG. 8 is a simplified perspective view of the support surface of an electrostatic chuck illustrating one embodiment of an inner zone and an outer zone of the chuck support surface.

Generally, if such an IHC-MFC assembly were supplied with only one IHC-MFC 200 for outer zone 820, for example, the outer portion of the wafer 802 may be etched at a faster rate than the inner portion of the wafer 802. By providing an independent IHC-MFC 100 for inner zone 810, for example, the inventive cooling system provides uniform radial cooling across the wafer 802 disposed on the surface of chuck 800. Those of skill in the art will appreciate that the inventive cooling system described herein is not limited to use in an etching apparatus. It is within the scope and contemplation of the present invention to employ the cooling system with other types of semiconductor fabrication apparatus performing process steps other than etching.

FIG. 8 is a simplified perspective view of the support surface of an electrostatic chuck illustrating one embodiment of an inner zone and an outer zone of the chuck support surface. During operation of a reaction chamber, a coolant such as liquid helium or a helium mixture as described above, for example, may generally be used to cool the wafer 802 disposed on chuck 800 during processing. As noted above, chuck 800 may advantageously be divided into at least an outer zone 820 and an inner zone 810 for uniform radial cooling across wafer 802 which is supported by chuck 800 during processing; coolant flow to each of inner zone 810 and outer zone 820 may be controlled by an independent IHC-MFC 100 and 200, respectively, for example. For each IHC-MFC 100,200, a respective filter (such as illustrated in FIGS. 5 and 6, for example), may remove noise from the setpoint voltage signal. In such an embodiment (with reference to FIG. 2), a filter for IHC-MFC 100 may be disposed between the plug J1-8 at the setpoint control 102 and the junction J8-11 of INTCNT PCB 300; additionally, a filter for IHC-MFC 200 may be disposed between the plug J2-8 at the setpoint control 202 and the junction J7-1 of INTCNT PCB 300, wherein the junction J7-1 accommodates 15 pins.

Figure 4:
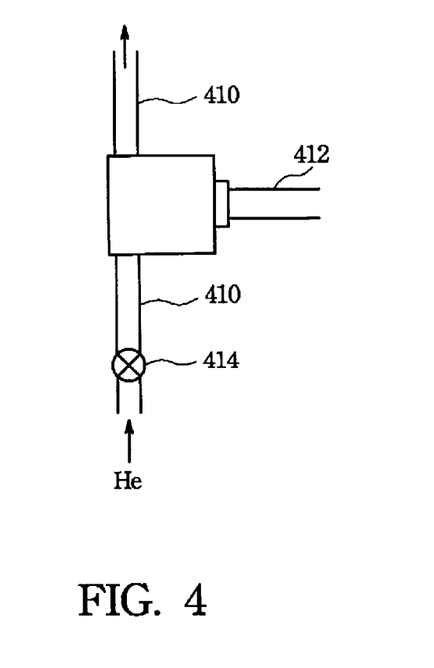
FIG. 4 is a schematic diagram illustrating a portion of one embodiment of a coolant supply assembly.

As noted briefly above, FIG. 4 is a schematic diagram illustrating a portion of one embodiment of a coolant supply assembly. As shown in FIG. 4, a coolant such as helium or a helium mixture may be delivered through conduit 410 to the back side or underside of a wafer (i.e. the side of the wafer facing the supporting surface of the chuck). The line 412 on the right side of FIG. 4 represents a line for transmitting setpoint control signals from setpoint control 102,202. Additionally, a valve 414 disposed in the conduit 410 may be employed to control coolant flow through conduit 410; that is, when valve 414 is open, coolant may flow through conduit 410 to cool the wafer.

As illustrated by the fluctuating graphs 12 and 14 in FIG. 1, the flow of coolant may spike after valve 414 (FIG. 4) is open; as a consequence, noise may be introduced as represented by reference numerals 12' and 14'. Those of ordinary skill in the relevant art have heretofore concluded that noise 12' and 14' is due to the RF power of the apparatus and the magnetic field surrounding the cables 134,136 adjacent to the FLOW terminal 104 and the PRESSURE terminal 106 (FIG. 2). According to applicant's study, however, neither RF power nor magnetic influence is the root cause of the spike problem. Applicant has insulated cables 134,136 with a mass of lead, for example, to prevent interference by any electrical or magnetic field, but such measures failed to improve the spike problem.

Similarly, the spikes may be minimized or partially eliminated by swapping boards, such as INTCNT PCB 300, for example; changing boards is tedious and troublesome, however, and does not solve the spike problem consistently. For example, changing the INTCNT PCB 300 of one cooling system may reduce coolant mass flow or pressure fluctuations, whereas changing the INTCNT PCB 300 of a different cooling system may not effectuate a similar result. Even for the same cooling system, the spike problem is not always corrected or even improved when the INTCNT PCB 300 is changed.

With this background, applicant measured the signals at the FLOW terminal 104 and the PRESSURE terminal 106, and found that these signals spike abruptly. Similarly, measurements revealed that the voltage signals at setpoint control 102 tend to fluctuate seriously. The root cause of the coolant mass flow spike problem was determined to be this spiking voltage signal at setpoint control 102, rather than electrical or magnetic fields.

More specifically, in an ideal case, a constant voltage input at setpoint control 102 should result in a constant AI signal at the FLOW terminal 104. Actually, the flow seriously spikes because the voltage input from setpoint control 102 inherently has noise.

Applicant transmitted a constant voltage of about +5V or +10V from the terminal indicated as +15V to the setpoint control 102, by using devices such as resistors. Driven by constant voltage, the flow of coolant is very uniform. FIG. 3 is a graphical representation of the AI signal from the FLOW terminal 104, which is displayed on a monitor of a computer. As shown in FIG. 3, the abscissa indicates time (in seconds), while the ordinate values represent the mass flow of coolant (in $10^{-2}$ sccm). The two generally horizontal lines are an indication that stability of coolant flow may be achieved with a constant voltage input. Accordingly, the spike problem at the FLOW terminal 104 or the PRESSURE terminal 106 may be resolved through careful control and filtering of the voltage at setpoint control 102.

It will be appreciated that the present invention has at least the following advantages: the filter circuit or the integrated circuit may stabilize coolant mass flow and pressure, thereby solving the spiking problem; since the flow of coolant is stabilized, the wafer will not be subjected to fluctuating forces exerted by a non-uniform coolant flow, and the uniformity of the process is therefore increased; coolant is uniformly provided throughout the duration of the process step (such as etching, for example), thereby increasing the uniformity of the process.

Figure 9:
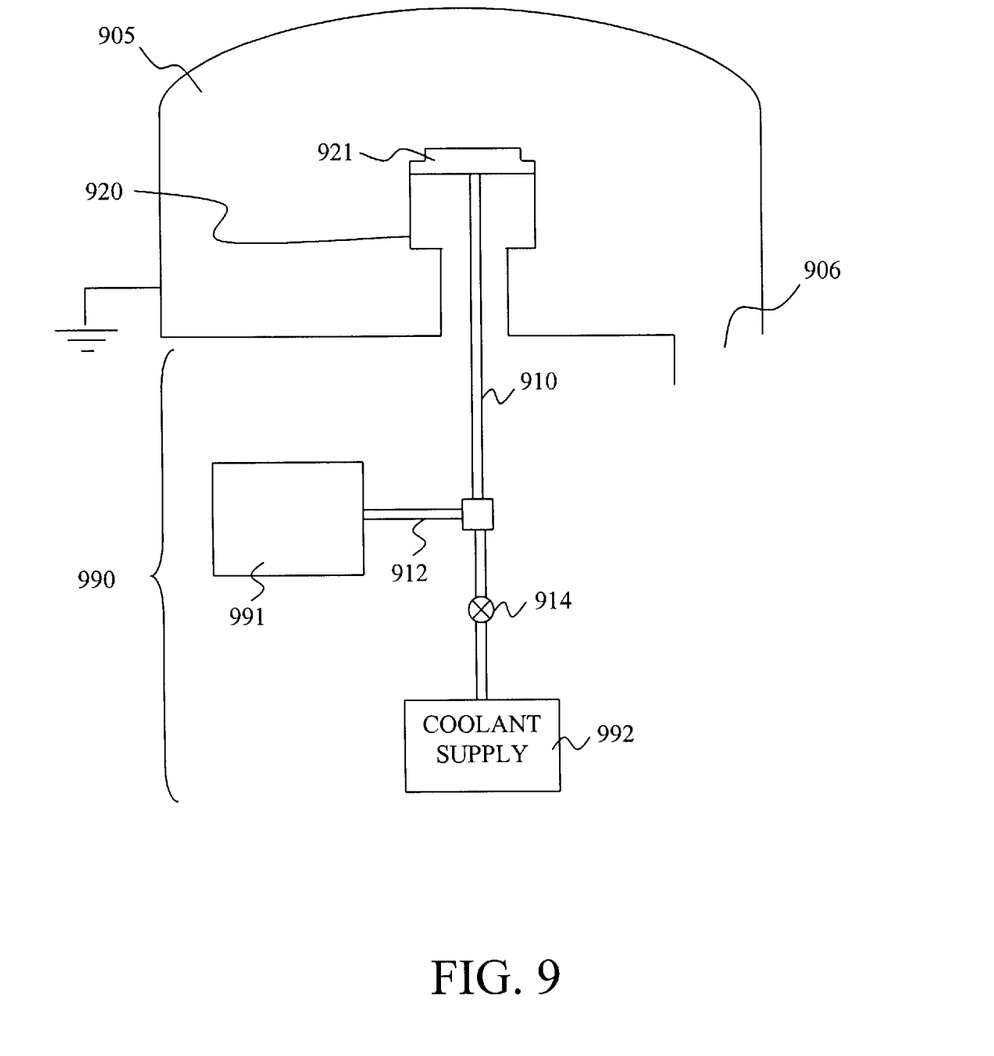
FIG. 9 is a simplified diagrammatic view of a cooling system in use with a reaction chamber.

FIG. 9 is a simplified view of a cooling system in use with a reaction chamber. The semiconductor fabrication apparatus may be generally constituted by a reaction chamber 905 and a cooling system 990. As is common in the art, reaction chamber 905 may include an exhaust 906 and an electrostatic chuck 920; as discussed above, reaction chamber 905 may be adapted for performing an etch process or other process on a silicon wafer. During operation, a wafer 921 to be processed may be supported on chuck 920 as described above. It will be appreciated that chamber 905 and chuck 920 are well known in the art.

A cooling system 990 may generally be constituted by the hardware elements illustrated in FIGS. 2 and 4, and may advantageously employ one or more filter circuits such as illustrated in FIGS. 5 and 6 to stabilize coolant mass flow and pressure. Specifically, cooling system 990 may employ an INTCNT PCB 300, an I/O PCB 400, an AI/O PCB 500, and one or more IHC-MFC 100,200. Filters such as illustrated in FIGS. 5 and 6, for example, may be employed to stabilize the voltage signals from IHC-MFC 100,200, thus providing uniform coolant flow as discussed above.

The foregoing circuit and electronic elements are represented by reference numeral 991 in FIG. 9. Cooling system 990 generally may operate in accordance with the foregoing detailed description. In particular, conduit 910, corresponding to conduit 410 described above with reference to FIG. 4, and may provide coolant (such as liquid helium or a liquid helium mixture as described above) from coolant supply 992 through chuck 920 to wafer 921 being processed when valve 914 is open. As discussed above with reference to FIG. 4, line 912 may be used for communicating setpoint control signals from setpoint control 102,202; appropriate hardware may be included to throttle valve 914 responsive to signals in line 912.

Those of skill in the art will appreciate that the relative arrangement of elements illustrated in FIG. 9 is intended to be exemplary only; that is, cooling system 990 may be located in any convenient location relative to chamber 905 such that delivery of coolant may be effectuated through chuck 920.

From the foregoing, it can be seen that the cooling system of the present invention provides versatile and efficient wafer cooling during a semiconductor process. The embodiments disclosed herein have been described and illustrated by way of example only, and not by way of limitation. Other modifications and variations to the invention will be apparent to those skilled in the art from the foregoing detailed disclosure. While only certain embodiments of the invention have been specifically described herein, it will be apparent that numerous modifications may be made thereto without departing from the spirit and scope of the invention.

What is claimed is:

1. A cooling system for supplying a reaction chamber with coolant during a semiconductor fabrication process; said cooling system comprising:
   coolant supply circuitry which controls supply of said coolant;
   a coolant flow controller having a setpoint control to set a flow of said coolant by transmitting a voltage signal to said circuitry; and
   a filter for removing noise from said voltage signal to stabilize said flow of said coolant.

2. The cooling system of claim 1, wherein said setpoint control further sets a coolant pressure.

3. The cooling system of claim 1, wherein said filter comprises a circuit comprising a resistor and a capacitor.

4. The cooling system of claim 3, wherein said filter has a delay time of less than about 3 seconds.

5. The cooling system of claim 3, wherein said capacitor has a capacitance of about 220 $\mu$F.

6. The cooling system of claim 5, wherein said resistor has a resistance of about 1600 ohms.

7. The cooling system of claim 3, wherein said setpoint control is electrically connected to a node between said resistor and said capacitor.

8. The cooling system of claim 7, wherein said setpoint control has a plug and is electrically connected to said node through said plug.

9. The cooling system of claim 3, wherein said capacitor has a first terminal connected to ground and a second terminal electrically connected to a first terminal of said resistor.

10. The cooling system of claim 9, wherein said resistor has a second terminal electrically connected to said coolant supply circuitry.

11. The cooling system of claim 3, wherein said capacitor is electrically connected to a junction in said coolant supply circuitry.

12. The cooling system of claim 1, wherein said filter comprises a plug electrically connected to a junction in said coolant supply circuitry.

13. The cooling system of claim 1, wherein said coolant is helium.

14. The cooling system of claim 1, wherein said coolant is a mixture of helium, ethylene glycol, and de-ionized water.

15. The cooling system of claim 1, wherein said filter comprises an integrated circuit.

16. The cooling system of claim 1, further comprising:
   additional coolant supply circuitry which controls a second supply of said coolant;
   an additional coolant flow controller having an additional setpoint control to set a second flow of said coolant by transmitting a second voltage signal to said additional circuitry; and
   an additional filter for removing noise from said second voltage signal.

17. An apparatus for manufacturing semiconductor devices; said apparatus comprising:
- a chamber for performing a semiconductor process on a wafer therein;
- a control system that controls a flow of coolant to cool the wafer when the semiconductor process is performed; said control system having a setpoint control to set the flow of coolant by transmitting a voltage signal; and
- a filter for removing noise from said voltage signal.

18. The apparatus of claim 17, further comprising a warning system for producing an alarm when the flow of coolant is not uniform.

19. The apparatus of claim 18, wherein said warning system detects the flow of coolant to determine if the alarm should be produced after said wafer is cooled for a predetermined period of time.

20. The apparatus of claim 19, wherein said filter has a delay time less than said predetermined period of time.

21. The apparatus of claim 17, wherein said filter comprises a resistor and a capacitor.

22. The apparatus of claim 17, wherein said filter comprises an integrated circuit.

23. The apparatus of claim 17, wherein said coolant is helium.

24. The apparatus of claim 17, wherein said coolant is a mixture of helium, ethylene glycol, and de-ionized water.

25. The apparatus of claim 17, further comprising:
- a second control system that controls a second flow of coolant to cool the wafer when the semiconductor process is performed; said second control system having a second setpoint control to set said second flow of coolant by transmitting a second voltage signal; and
- a second filter for removing noise from said second voltage signal.

* * * * *